(12) United States Patent
Noto

(10) Patent No.: US 10,727,803 B2
(45) Date of Patent: Jul. 28, 2020

(54) PIEZOELECTRIC VIBRATION MEMBER AND METHOD OF MANUFACTURING THE SAME

(71) Applicant: Murata Manufacturing Co., Ltd., Nagaokakyo-shi, Kyoto-fu (JP)

(72) Inventor: Kazuyuki Noto, Nagaokakyo (JP)

(73) Assignee: MURATA MANUFACTURING CO., LTD., Nagaokakyo-Shi, Kyoto-Fu (JP)

( * ) Notice: Subject to any disclaimer, the term of this patent is extended or adjusted under 35 U.S.C. 154(b) by 631 days.

(21) Appl. No.: 15/623,553

(22) Filed: Jun. 15, 2017

(65) Prior Publication Data

US 2017/0302242 A1 Oct. 19, 2017

Related U.S. Application Data

(63) Continuation of application No. PCT/JP2015/076435, filed on Sep. 17, 2015.

(30) Foreign Application Priority Data

Jan. 16, 2015 (JP) .................. 2015-007111

(51) Int. Cl.
*H03H 3/04* (2006.01)
*H01L 23/10* (2006.01)
(Continued)

(52) U.S. Cl.
CPC .............. *H03H 3/04* (2013.01); *H01L 23/10* (2013.01); *H01L 41/253* (2013.01); *H03H 3/02* (2013.01);
(Continued)

(58) Field of Classification Search
CPC .... H03H 3/02; H03H 3/04; H03H 2003/0428; H03H 2003/0435; H03H 9/02; H03H 9/1021; H01L 23/10; H01L 41/253
(Continued)

(56) References Cited

U.S. PATENT DOCUMENTS

| 2004/0130807 A1* | 7/2004 | Hattori .................. G02B 7/022 359/811 |
| 2014/0292143 A1 | 10/2014 | Ichikawa |
| 2018/0180635 A1* | 6/2018 | Lapham ................. G16H 40/60 |

FOREIGN PATENT DOCUMENTS

| JP | 2012-074937 A | 4/2012 |
| JP | 2013-197520 A | 9/2013 |
| JP | 2014-197615 A | 10/2014 |

OTHER PUBLICATIONS

International Search Report issued in International Application No. PCT/JP2015/076435, dated Oct. 27, 2015.
(Continued)

*Primary Examiner* — Thomas M Dougherty
(74) *Attorney, Agent, or Firm* — Arent Fox LLP

(57) ABSTRACT

A piezoelectric vibration member that includes a substrate having a main surface on or in which a piezoelectric vibration member is mounted, a lid having a recess that is open so as to face the main surface and which includes a flange portion that projects outward from an opening edge of the recess, and a bonding layer that bonds the substrate and the lid together so as to hermetically seal the piezoelectric vibrator in a space between the recess and the main surface. The surface roughness of a side surface of the flange portion is greater than the surface roughness of the surface of the recess, and the bonding layer extends from the main surface of the substrate to the side surface of the flange portion.

11 Claims, 8 Drawing Sheets

(51) Int. Cl.
*H03H 3/02* (2006.01)
*H03H 9/10* (2006.01)
*H03H 9/02* (2006.01)
*H01L 41/253* (2013.01)

(52) U.S. Cl.
CPC ............ *H03H 9/02* (2013.01); *H03H 9/1021* (2013.01); *H03H 2003/0428* (2013.01); *H03H 2003/0435* (2013.01)

(58) Field of Classification Search
USPC ........................................ 310/340, 344, 348
See application file for complete search history.

(56) References Cited

OTHER PUBLICATIONS

Written Opinion of the International Searching Authority issued in International Application No. PCT/JP2015/076435, dated Oct. 27, 2015.

\* cited by examiner

PIEZOELECTRIC VIBRATION MEMBER AND METHOD OF MANUFACTURING THE SAME

CROSS REFERENCE TO RELATED APPLICATIONS

The present application is a continuation of International application No. PCT/JP2015/076435, filed Sep. 17, 2015, which claims priority to Japanese Patent Application No. 2015-007111, filed Jan. 16, 2015, the entire contents of each of which are incorporated herein by reference.

FIELD OF THE INVENTION

The present invention relates to a piezoelectric vibration member and a method of manufacturing the piezoelectric vibration member.

BACKGROUND OF THE INVENTION

Piezoelectric vibrators have been widely used as oscillators and band-pass filters. For example, as an aspect of a piezoelectric vibrator of the related art, Patent Document 1 describes a surface-mount crystal unit having a structure for hermetically sealing a crystal unit such that the crystal unit will not be exposed to the outside air. The surface-mount crystal unit described in Patent Document 1 includes a substrate onto which a crystal unit is mounted and a lid that hermetically seals the crystal unit with an adhesive interposed therebetween (see in Patent Document 1).

Patent Document 1: Japanese Unexamined Patent Application Publication No. 2014-197615

SUMMARY OF THE INVENTION

However, in the case where the interface strength between the lid and the adhesive is insufficient, the lid may sometimes separate from the substrate. For example, in the case where the roughness of a surface of the lid is small, the surface being in contact with the substrate, the wettability of the adhesive deteriorates, and consequently, a decrease in the interface strength between the lid and the adhesive is likely to occur. In particular, in the case of hermetically sealing the crystal unit by bonding the lid and the substrate to each other with a thermosetting adhesive, when a reflow heating temperature is about 260° C., the pressure in the lid increases, and the lid may sometimes separate from the substrate.

The present invention has been made in view of the above situation, and it is an object of the present invention to improve the adhesion strength between a lid and a bonding layer that are used for hermetically sealing a piezoelectric vibrator mounted on a substrate.

A piezoelectric vibration member according to an aspect of the present invention includes a substrate having a main surface on or in which a piezoelectric vibrator is mounted, a lid having a recess that is open so as to face the main surface and includes a flange portion that projects outward from an opening edge of the recess, and a bonding layer that bonds the substrate and the lid together so as to hermetically seal the piezoelectric vibrator in a space between the recess and the main surface. A surface roughness of a side surface of the flange portion is greater than a surface roughness of the surface of the recess, and the bonding layer extends from the main surface of the substrate to the side surface of the flange portion.

According to the present invention, the adhesion strength between a lid and a bonding layer that are used for hermetically sealing a piezoelectric vibrator mounted on a substrate can be improved.

DETAILED DESCRIPTION OF THE PREFERRED EMBODIMENTS

A first embodiment of the present invention will be described below with reference to FIG. 1 to FIG. 4.

Figure 1:
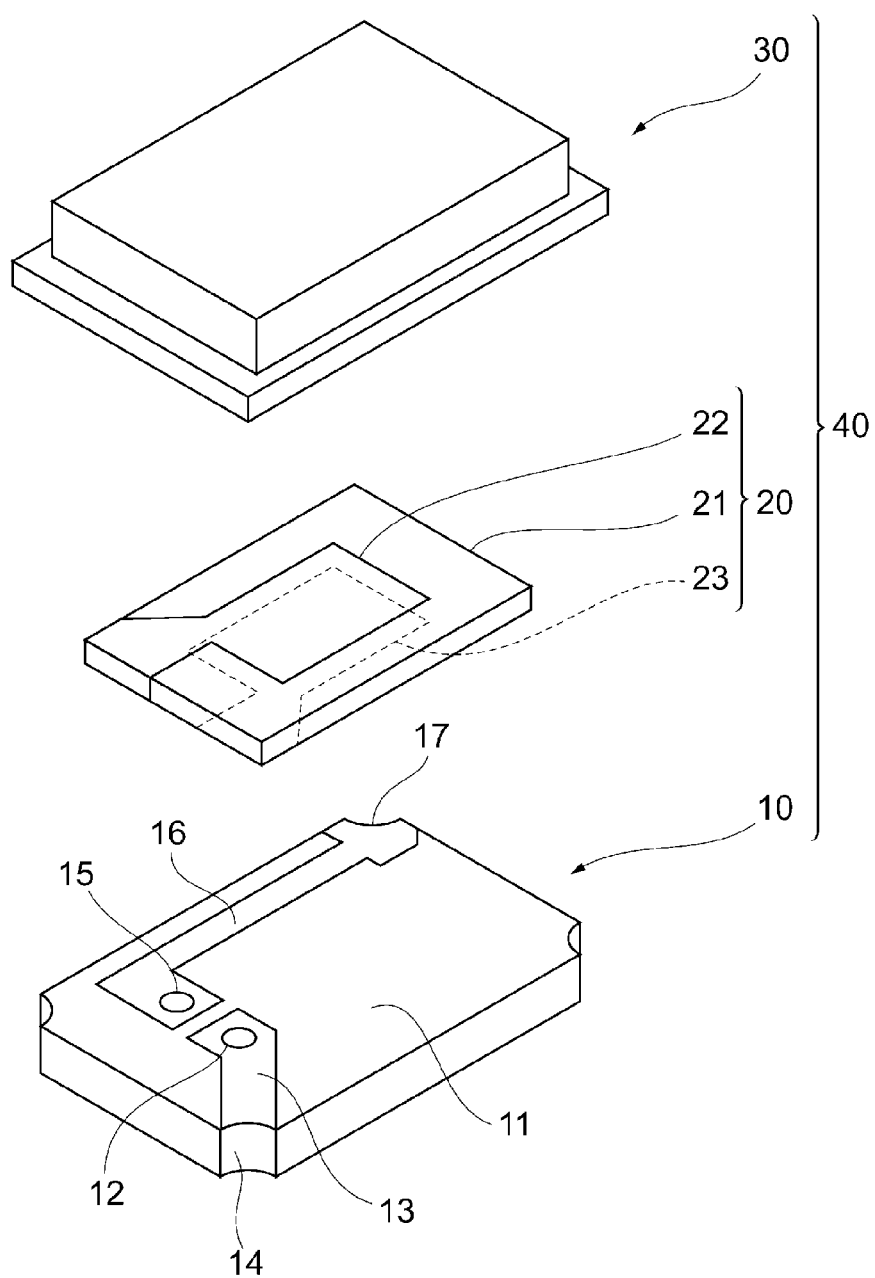
FIG. 1 is an exploded perspective view of a piezoelectric vibration member according to a first embodiment of the present invention.

FIG. 1 is an exploded perspective view of a piezoelectric vibration member 40 according to the first embodiment of the present invention. As illustrated in FIG. 1, the piezoelectric vibration member 40 mainly includes a piezoelectric vibrator 20, a substrate 10 having a main surface 11 on or in which the piezoelectric vibrator 20 is mounted, and a lid 30 that is used for hermetically sealing the piezoelectric vibrator 20 such that the piezoelectric vibrator 20 will not be exposed to the outside air. The piezoelectric vibrator 20 includes a piezoelectric plate 21 that has a flat plate-like shape and that has first and second surfaces internally facing each other in a thickness direction, an excitation electrode 22 that is formed on or in the first surface of the piezoelectric plate 21, and an excitation electrode 23 that is formed on or in the second surface of the piezoelectric plate 21. When an alternating-current voltage is applied to the excitation electrodes 22 and 23, the piezoelectric plate 21 vibrates in a thickness-shear mode. The piezoelectric plate 21 is made of a piezoelectric material (e.g., a crystal plate, a piezoelectric ceramic, or the like) that has piezoelectricity. Each of the excitation electrodes 22 and 23 is formed of, for example, an electrically conductive thin film made of gold, chrome, nickel, aluminum, titanium, or the like.

The substrate 10 has a flat plate-like shape having two surfaces internally facing each other in a thickness direction thereof, and one of the two surfaces on or in which the piezoelectric vibrator 20 is to be mounted will hereinafter be referred to as the main surface 11. A wiring line 13 that is electrically connected to the excitation electrode 23 via an electrically conductive adhesive 12 and a wiring line 16 that is electrically connected to the excitation electrode 22 via an electrically conductive adhesive 15 are formed on or in the main surface 11. The substrate 10 is made of a material having a suitable mechanical strength and a suitable electrical insulating property (e.g., an insulating ceramic such as alumina, a synthetic resin, or a composite material obtained by coating a surface of a metal plate with an insulating layer). Note that the substrate 10 has cutout portions 14 and 17 each of which is formed by partially cutting out a corner portion of the substrate 10 into a cylindrical curved shape, and the wiring lines 13 and 16 extend to the other of the two surfaces of the substrate 10, the other surface being opposite to the main surface 11, through the cutout portions 14 and 17, respectively, so that the wiring lines 13 and 16 can be connected to an external circuit.

Figure 4:
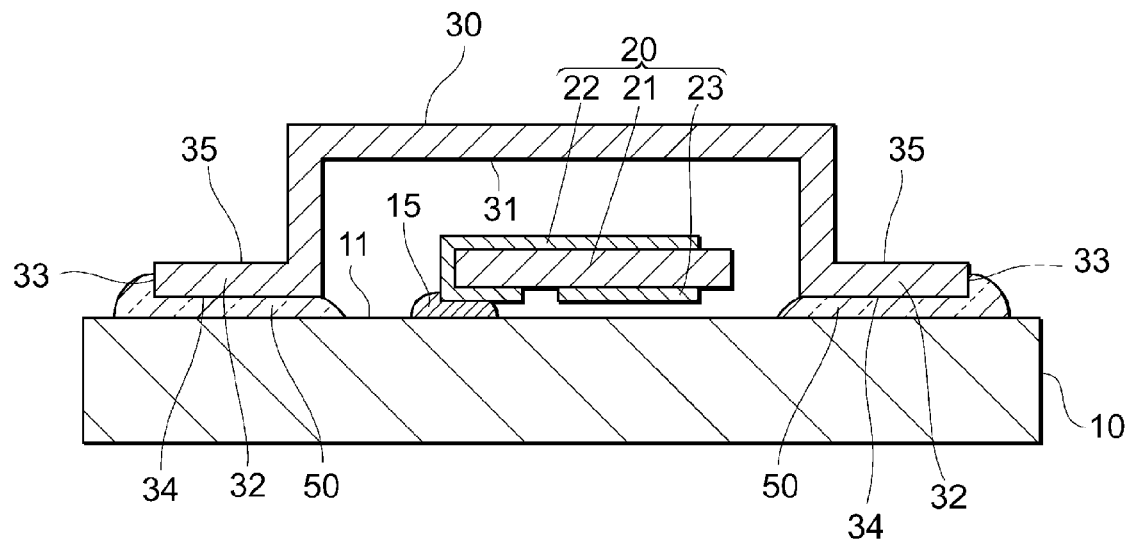
FIG. 4 is a cross-sectional view illustrating the process of manufacturing the piezoelectric vibration member according to the first embodiment of the present invention.

The lid 30 is a cover member with a bottom used for hermetically sealing the piezoelectric vibrator 20 such that the piezoelectric vibrator 20 will not be exposed to the outside air, and as illustrated in FIG. 4, the lid 30 includes a recess 31 that is open so as to face the main surface 11 and a flange portion 32 that projects outward from an opening edge of the recess 31. The recess 31 is a recess with a bottom that is recessed toward the inner side of the lid 30 and has an opening area and an opening depth that are large enough to seal the piezoelectric vibrator 20. The flange portion 32 forms a substantially rectangular ring shape surrounding the peripheral edge of the recess 31. The lid 30 may be made of a metal material, an insulating material, or a composite material (e.g., a composite material obtained by coating a surface of an insulating member with a metal thin film). A bonding layer 50 causes the substrate 10 and the lid 30 to be bonded together so as to hermetically seal the piezoelectric vibrator 20 in a space between the recess 31 and the main surface 11. The bonding layer 50 is not particularly limited as long as the bonding layer 50 is made of an insulating adhesive, and for example, a non-conductive adhesive that obtains an adhesive property by being cured through a heat treatment can be used. As such an adhesive, for example, an epoxy-based adhesive agent that contains, as a main component, an epoxy resin can be used. As an epoxy resin, for example, a bisphenol A epoxy resin, a bifunctional epoxy resin such as a bisphenol F epoxy resin, a novolac-type epoxy resin such as a phenolic novolac-type epoxy resin or a cresol novolac-type epoxy resin, or the like can be used. Alternatively, a commonly known epoxy resin, such as a polyfunctional epoxy resin, a glycidyl amine-type epoxy resin, a heterocyclic-containing epoxy resin, or an alicyclic epoxy resin, can be used. The bonding layer 50 is not limited to being made of an epoxy-based adhesive agent and may be made of, for example, a low-melting-point adhesive. The low-melting glass adhesive may include lead-free, vanadium-based glass that melts at a temperature of 300° C. or higher and 410° C. or lower. Vanadium-based glass obtains an adhesive property as a result of a binder and a solvent being added thereto so as to be in paste form and being solidified after being melted. Vanadium-based glass has a high hermeticity and high reliabilities, such as water resistance and humidity resistance. In addition, the thermal expansion coefficient of vanadium-based glass can be flexibly controlled by controlling a glass structure. Note that the lid 30 may also be referred to as a cap, a cover, or a package member.

Figure 2:
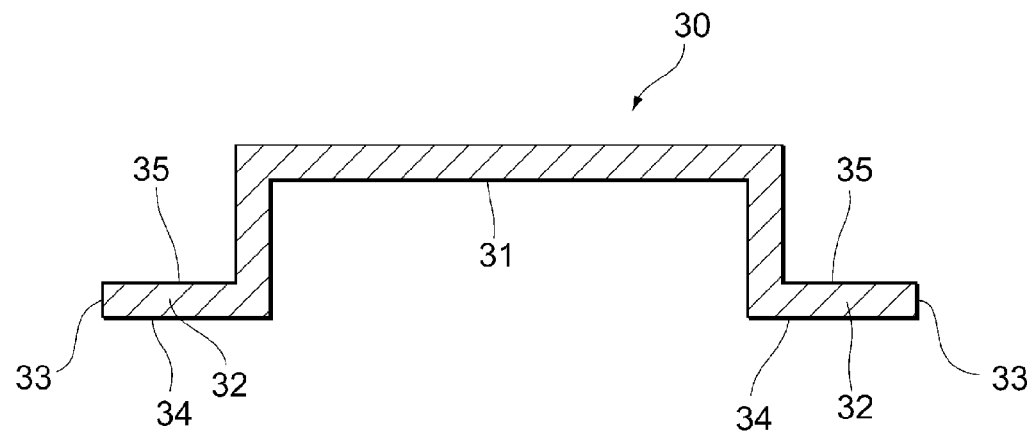
FIG. 2 is a cross-sectional view illustrating a process of manufacturing the piezoelectric vibration member according to the first embodiment of the present invention.
Figure 3:
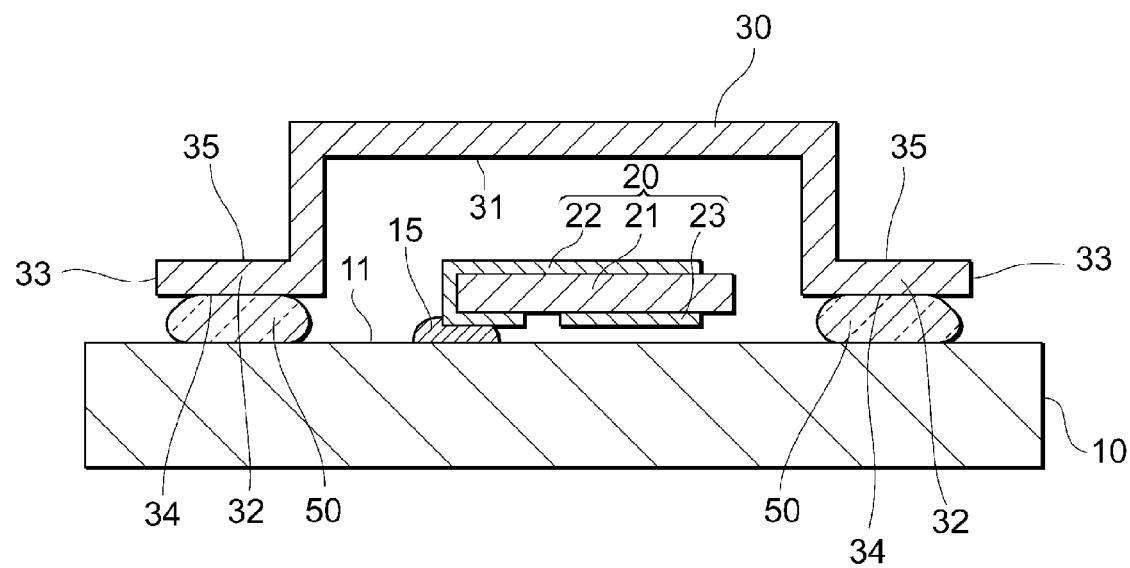
FIG. 3 is a cross-sectional view illustrating the process of manufacturing the piezoelectric vibration member according to the first embodiment of the present invention.

A process of manufacturing the piezoelectric vibration member 40 will now be described with reference to FIG. 1 to FIG. 4. First, as illustrated in FIG. 1, the substrate 10 on or in which the piezoelectric vibrator 20 has been mounted is prepared. Next, as illustrated in FIG. 2, the lid 30 that has undergone a surface roughening treatment such that the surface roughness of a side surface 33 of the flange portion 32 is greater than the surface roughness of the surface of the recess 31 is prepared. As the surface roughening treatment, for example, a plasma treatment, sandblasting, or the like can be employed. Sandblasting is a treatment that roughens a to-be-machined surface by, for example, ejecting fine particles (e.g., abrasive particles such as alumina and diamond) together with compressed air toward the to-be-machined surface. Note that the side surface of the flange portion 32 is a surface connecting a joint surface 34 of the flange portion 32, which is bonded to the main surface 11 of the substrate 10 with the bonding layer 50 interposed therebetween, and a top surface 35, which is opposite to the joint surface 34, to each other. The side surface of the flange portion 32, which has undergone a surface roughening treatment, has a rough surface in and on which depressions and projections are formed when viewed in cross section, the rough surface having a surface roughness greater than the surface roughness of the surface of the recess 31. Next, as illustrated in FIG. 3, the bonding layer 50 is formed into a substantially frame-like shape on or in the main surface 11 such that the peripheral edge of the flange portion 32 surrounds the piezoelectric vibrator 20 while being arranged at a position where the peripheral edge of the flange portion 32 is to be bonded to the main surface 11. In this case, it is preferable that the bonding layer 50 be applied so as to spread out uniformly on the main surface 11 and to have a uniform film thickness.

Next, as illustrated in FIG. 4, the lid 30 and the substrate 10 are pressed against each other so as to help the bonding layer 50 extend from the main surface 11 of the substrate 10 to the side surface 33 of the flange portion 32 while being bent in a substantially L shape when viewed in cross section and coat a portion of the flange portion 32. Then, heat is applied to the bonding layer 50 such that binding (cross-linking curing) between molecules included in the bonding layer 50 is facilitated, and that the bonding layer 50 is caused to transition to a cured state. In this manner, the piezoelectric vibrator 20 can be hermetically sealed in the space between the recess 31 and the main surface 11. It is commonly known that the contact angle of a liquid droplet is sensitive to surface roughness. Here, surface roughness can be defined as the ratio of a rough surface to a flat surface. For example, as surface roughness increases, the contact angle of a liquid droplet decreases (the wettability is increased) in a lyophilic surface, and in contrast, the contact angle of a liquid droplet increases (the wettability is decreased) in a lyophobic surface. On the basis of the above knowledge, the material of the lid 30 is selected such that the lid 30 has a lyophilic property with respect to the bonding layer 50, and the surface roughness of the side surface 33 of the flange portion 32 is set to be greater than the surface roughness of the surface of the recess 31. As a result, the contact angle of the bonding layer 50 with respect to the side surface 33 of the flange portion 32 can be decreased, and the bonding layer 50 can spread out uniformly. With such a structure, when the lid 30 and the substrate 10 are pressed against each other, the bonding layer 50, which is pushed from a position between the main surface 11 of the substrate 10 and the flange portion 32 of the lid 30, extends from the main surface 11 of the substrate 10 to the side surface 33 of the flange portion 32 and is likely to enter the very small depressions and projections formed in and on the side surface 33. Consequently, an anchor effect, a Van der Waals force, and the like are exerted in a composite manner, and the adhesion strength generated at the interface between the side surface 33 of the flange portion 32 and the bonding layer 50 can be improved.

Note that the surface roughness of every portion of the side surface 33 of the flange portion 32 may be greater than the surface roughness of the surface of the recess 31, or the surface roughness of only a portion of the side surface 33 of the flange portion 32 may be greater than the surface roughness of the surface of the recess 31. The bonding layer 50 may be formed on or in a portion of or the entire peripheral edge of the flange portion 32 so as to extend from the main surface 11 of the substrate 10 to the side surface 33 of the flange portion 32. It is preferable that the surface roughness of the joint surface 34 be greater than the surface roughness of the surface of the recess 31. As a result, the bonding layer 50 can easily spread out from the joint surface 34 of the flange portion 32 to the side surface 33, and thus, the adhesion strength between the bonding layer 50 and the lid 30 can be improved. In addition, by setting the surface roughness of the joint surface 34 to be greater than the surface roughness of the surface of the recess 31, the probability that the bonding layer 50 will enter the recess 31 can be reduced. In the case where the bonding layer 50 enters the recess 31, for example, there is a possibility that gas emitted from the bonding layer 50 will be attracted to the excitation electrodes 22 and 23 that define a vibration region of the piezoelectric vibrator 20, which in turn results in variations in the oscillation frequency of the piezoelectric vibrator 20, and thus, it is preferable that the bonding layer 50 not enter the recess 31.

Figure 14:
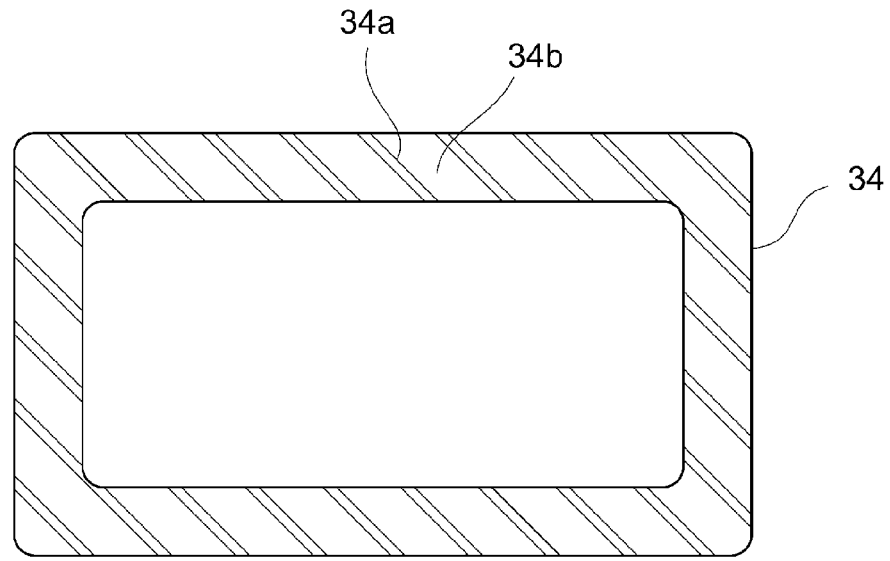
FIG. 14 is a diagram illustrating an aspect of a lid of the piezoelectric vibration member according to the first embodiment of the present invention.
Figure 15:
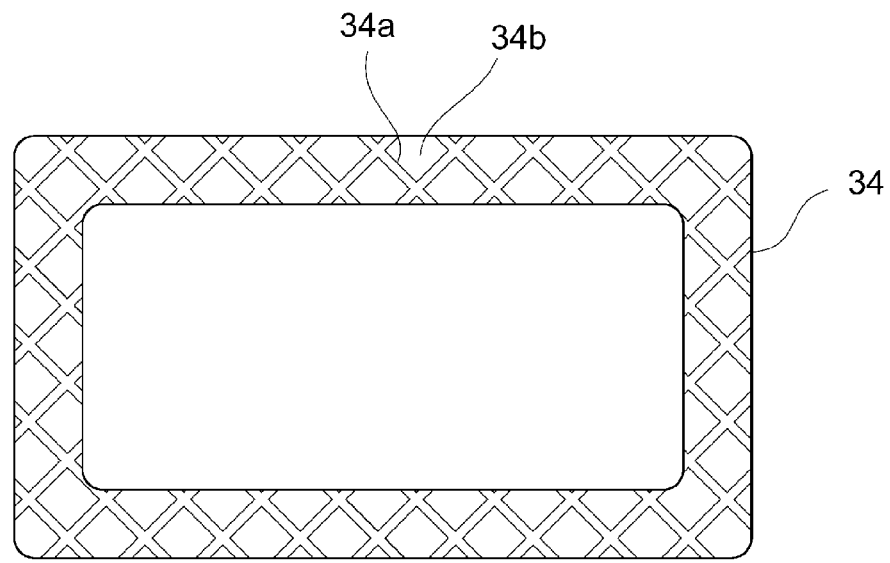
FIG. 15 is a diagram illustrating another aspect of the lid of the piezoelectric vibration member according to the first embodiment of the present invention.

Depressions and projections may be formed in and on the joint surface 34. For example, as illustrated in FIG. 14, a plurality of depressions 34a each having a linear shape (or a plurality of projections 34b each having a linear shape) may be formed in the joint surface 34 so as to be arranged approximately parallel to one another and equally spaced. In this case, the depressions 34a (projections 34b) may be formed so as to be inclined in an oblique direction with respect to a long side of the lid (e.g., be inclined at about 45 degrees). Regarding the widths of the depressions and the projections, in the example illustrated in FIG. 14, although each of the projections 34b is formed so as to have a width larger than the width of each of the depressions 34a, the depressions 34a and the projections 34b may have substantially the same width, or each of the depressions 34a may be formed so as to have a width larger than the width of each of the projections 34b. In addition, as another example of a shape having depressions and projections, as illustrated in FIG. 15, the plurality of depressions 34a each having a linear shape may also be arranged so as to be perpendicular to one another, and as a result, each of the projections 34b may be formed in a diamond shape. By forming depressions and projections in and on the joint surface 34, the surface area of the joint surface 34 increases, and the interface strength can be improved. In addition, as a result of the depressions 34a or the projections 34b being formed so as to be inclined in an oblique direction with respect to a long side or a short side of the lid, an improvement in the interface strength against stress in the long-side direction or the short-side direction of the lid that acts on the side surface of the lid can be achieved.

A second embodiment of the present invention will now be described with reference to FIG. 5 to FIG. 7.

Figure 5:
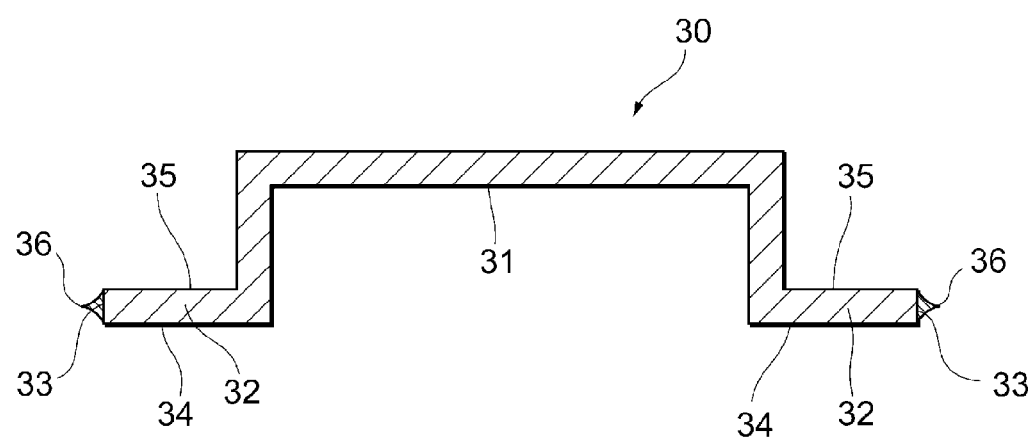
FIG. 5 is a cross-sectional view illustrating a process of manufacturing a piezoelectric vibration member according to a second embodiment of the present invention.
Figure 6:
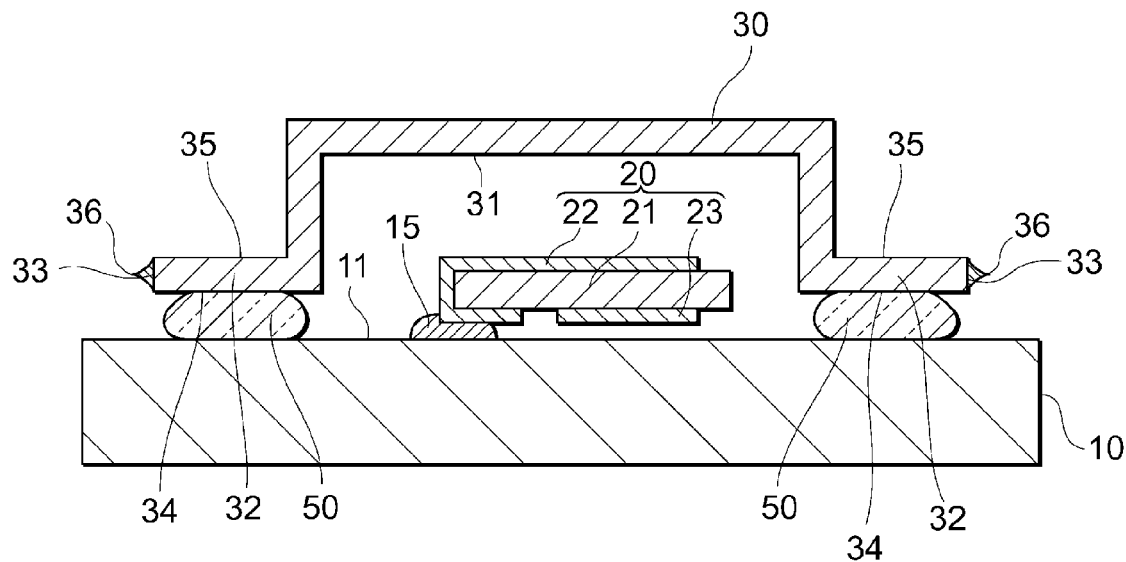
FIG. 6 is a cross-sectional view illustrating the process of manufacturing the piezoelectric vibration member according to the second embodiment of the present invention.
Figure 7:
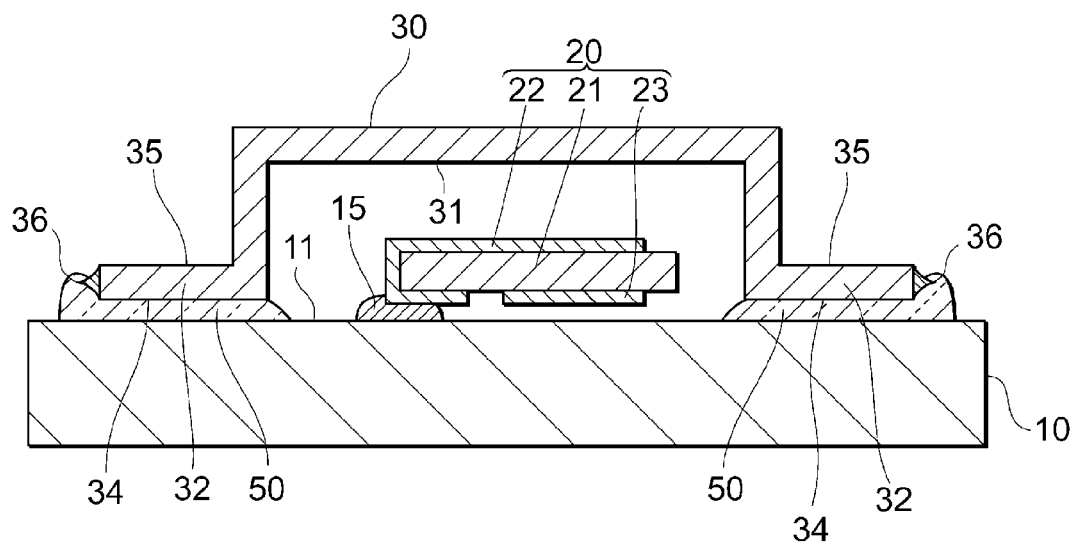
FIG. 7 is a cross-sectional view illustrating the process of manufacturing the piezoelectric vibration member according to the second embodiment of the present invention.

In FIG. 5 to FIG. 7, the reference numerals common to FIG. 1 to FIG. 4 denote the same members, and detailed descriptions of the members will be omitted. The difference between the flange portion 32 according to the second embodiment and the flange portion 32 according to the first embodiment is that the side surface 33 of the flange portion 32 according to the second embodiment includes at least one projection 36 as illustrated in FIG. 5. The side surface 33 of the flange portion 32 may include a plurality of the projections 36 formed along the whole periphery of the flange portion 32. For example, as a method of forming the projection 36, punching using a press machine, etching utilizing corrosion of metal, or the like can be employed. For example, in a process of manufacturing a plurality of the lids 30 by blanking a plurality of substrate pieces out from a single mother substrate, one or more projections 36 can be formed on the side surface 33 by using a shearing stress applied to the side surface 33 of the flange portion 32. After the lid 30, which has such a structure, has been prepared, as illustrated in FIG. 6, the bonding layer 50 is formed into a substantially frame-like shape on or in the main surface 11 such that the peripheral edge of the flange portion 32 surrounds the piezoelectric vibrator 20 while being arranged at a position where the peripheral edge of the flange portion 32 is to be bonded to the main surface 11.

Next, as illustrated in FIG. 7, the lid 30 and the substrate 10 are pressed against each other so as to help the bonding layer 50 extend from the main surface 11 of the substrate 10 to the side surface 33 of the flange portion 32 and coat an end portion of the at least one projection 36. The one projection 36 may include one end portion or may include a plurality of end portions. In the case where the one projection 36 includes a plurality of end portions, any one of the end portions may be coated with the bonding layer 50, and it is particularly preferable that the longest end portion be coated with the bonding layer 50. Then, heat is applied to the bonding layer 50 such that binding between the molecules included in the bonding layer 50 is facilitated, and that the bonding layer 50 is caused to transition to a cured state. In this manner, the piezoelectric vibrator 20 can be hermetically sealed in the space between the recess 31 and the main surface 11. As a result of the bonding layer 50 coating the projection 36 such that the end portion of the projection 36 is not exposed, an anchor effect that restricts movement of the lid 30 in a direction perpendicular to the main surface 11 of the substrate 10 can be obtained, and the adhesion strength between the bonding layer 50 and the lid 30 can be improved. Note that in the case where the side surface 33 of the flange portion 32 includes a plurality of projections 36 formed along the whole periphery of the flange portion 32, the bonding layer 50 may be formed so as to extend from the main surface 11 of the substrate 10 to the side surface 33 of the flange portion 32 and to coat the end portions of any one or more of the plurality of projections 36. Similar to the first embodiment, in the second embodiment, the surface roughness of the joint surface 34 may be set to be greater than the surface roughness of the surface of the recess 31, and a low-melting-point adhesive may be used as the bonding layer 50.

Figure 8:
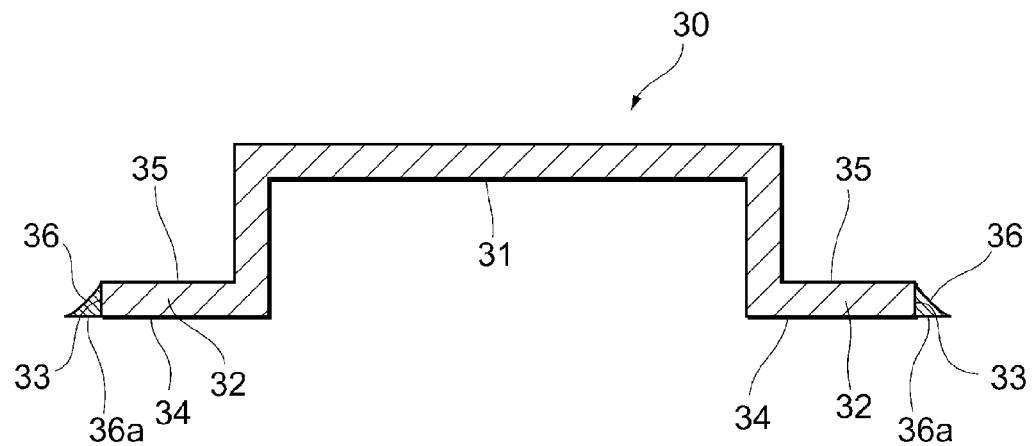
FIG. 8 is a cross-sectional view illustrating the process of manufacturing the piezoelectric vibration member according to the second embodiment of the present invention.
Figure 9:
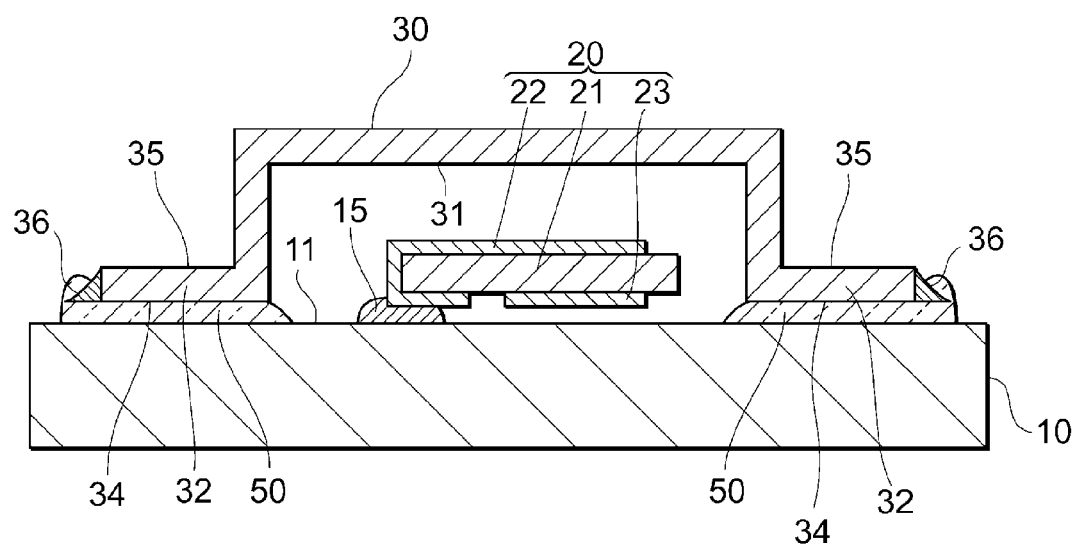
FIG. 9 is a cross-sectional view illustrating the process of manufacturing the piezoelectric vibration member according to the second embodiment of the present invention.
Figure 10:
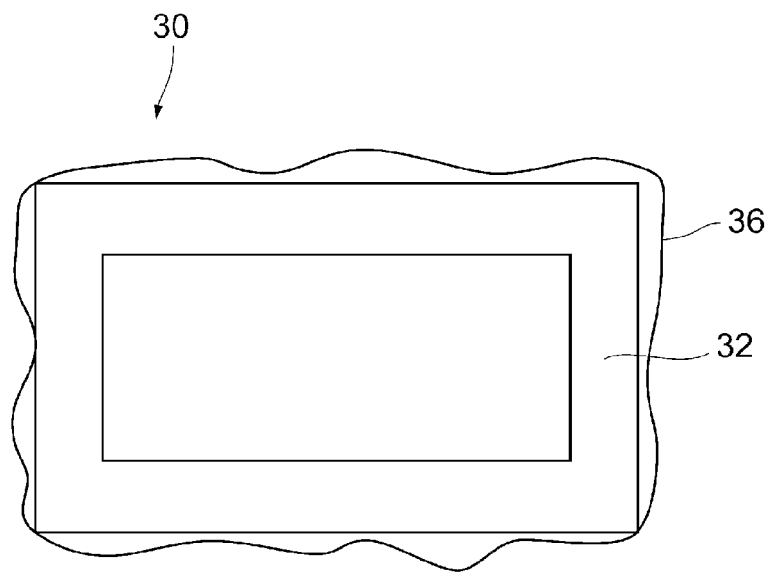
FIG. 10 is a plan view illustrating the process of manufacturing the piezoelectric vibration member according to the second embodiment of the present invention.
Figure 11:
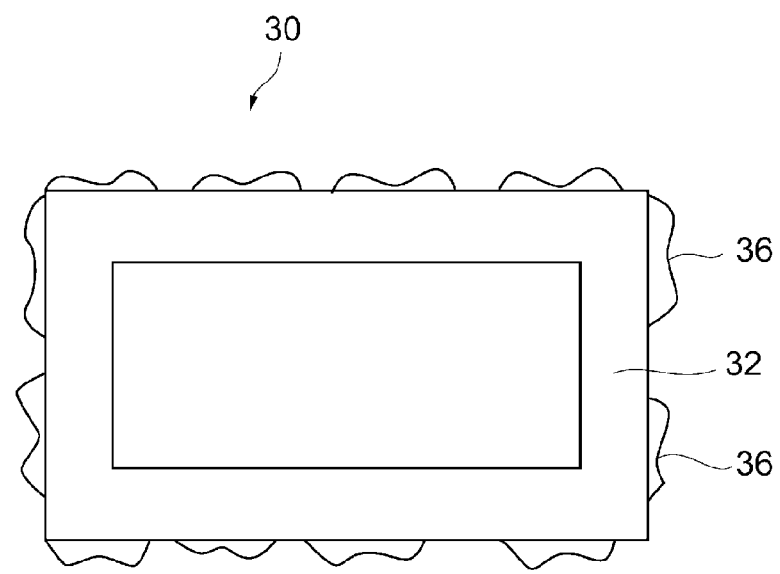
FIG. 11 is a plan view illustrating the process of manufacturing the piezoelectric vibration member according to the second embodiment of the present invention.
Figure 12:
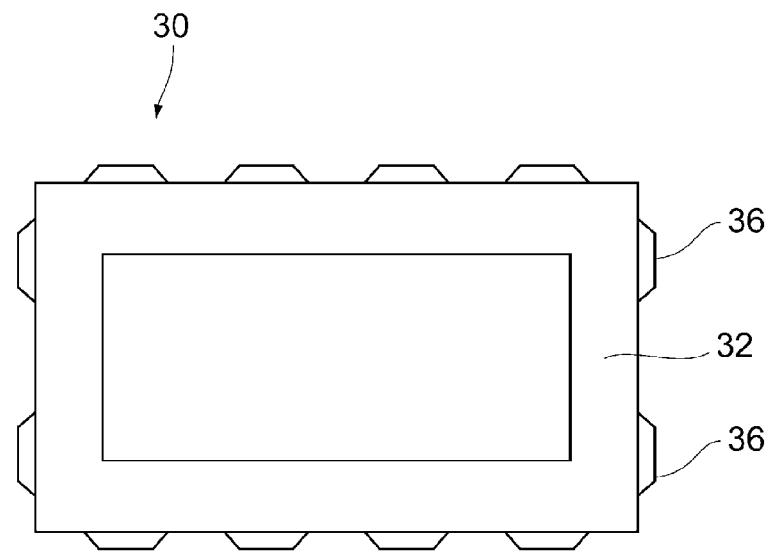
FIG. 12 is a plan view illustrating the process of manufacturing the piezoelectric vibration member according to the second embodiment of the present invention.
Figure 13:
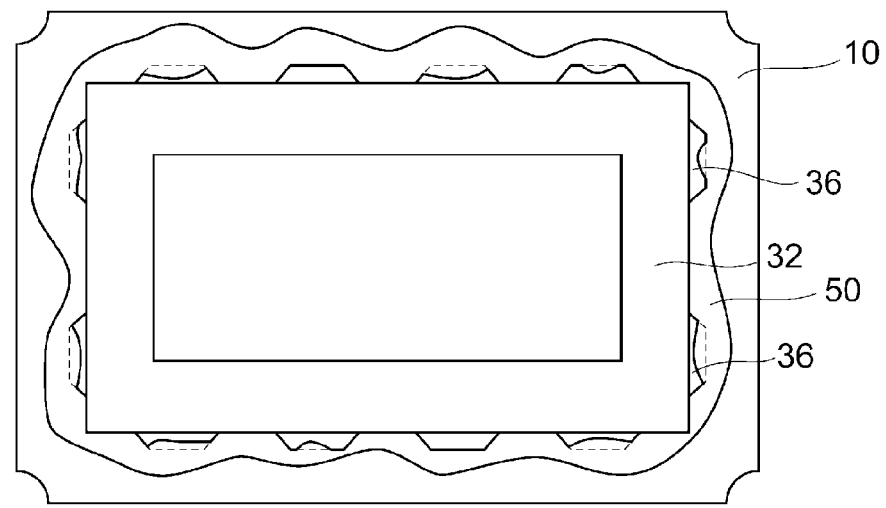
FIG. 13 is a plan view illustrating the process of manufacturing the piezoelectric vibration member according to the second embodiment of the present invention.

Note that, as illustrated in FIG. 8 and FIG. 9, the projection 36 formed on the side surface 33 of the lid 30 may have a surface 36a extending in a direction approximately parallel to the joint surface 34 and may have a cross-sectional shape in which the thickness thereof decreases with increasing distance from the base end to the tip end of the projection 36. FIG. 8 illustrates a cross-sectional view of the lid 30 at a stage before the substrate 10 is bonded to the substrate 10, and FIG. 9 illustrates a cross-sectional view of the piezoelectric vibration member 40 at a stage after the lid 30 has been bonded to the substrate 10. With such a structure, the bonding layer 50 is likely to coat the end portion of the projection 36. In addition, as illustrated in FIG. 10 to FIG. 12, when the projection 36 formed on the side surface 33 of the lid 30 is viewed from a direction perpendicular to the top surface 35 of the flange portion 32, the shape of the projection 36 in plan view may be a shape having a curved line, a shape having depressions and projections, or a shape having a bent line. FIG. 13 illustrates the case where the bonding layer 50 coats portions of the projections 36. Dotted lines indicate the portions of the projections 36 coated with the bonding layer 50. In this manner, it is not necessary for the bonding layer 50 to coat the entire projections 36 and may partially coat the projections 36.

Note that the embodiments have been described above for ease of understanding of the present invention and are not intended to limit the scope of the present invention. Changes and improvements may be made to the present invention within the scope of the present invention, and the present invention includes equivalents thereof. In other words, design changes may be suitably made to the embodiments by those skilled in the art, and such embodiments are also within the scope of the present invention as long as they have the features of the present invention. For example, the elements included in the embodiments and the arrangements, materials, conditions, shapes, sizes and the like of the elements are not limited to those described above as examples, and they may be suitably changed. In addition, the elements included in the embodiments can be combined with each other as long as it is technically possible, and such combinations are also within the scope of the present invention as long as the combinations have the features of the present invention.

REFERENCE SIGNS LIST 10 substrate
11 main surface
12 electrically conductive adhesive
13 wiring line
14 cutout portion
15 electrically conductive adhesive
16 wiring line
17 cutout portion
18 side surface
20 piezoelectric vibrator
21 piezoelectric plate
22 excitation electrode
23 excitation electrode
30 lid
31 recess
32 flange portion
40 piezoelectric vibration member
50 bonding layer

The invention claimed is:

1. A piezoelectric vibration member comprising:
a substrate having a main surface;
a piezoelectric vibrator mounted on the main surface of the substrate;
a lid having a recess that faces the main surface and includes a flange portion that projects outward from an opening edge of the recess and has a side surface; and
a bonding layer bonds the substrate and the lid together so as to hermetically seal the piezoelectric vibrator between the recess and the main surface, the bonding layer extending from the main surface of the substrate to the side surface of the flange portion,
wherein a first surface roughness of the side surface of the flange portion is greater than a second surface roughness of a surface of the recess.

2. The piezoelectric vibration member according to claim 1, wherein the first surface roughness of every portion of the side surface of the flange portion is greater than the second surface roughness of the surface of the recess.

3. The piezoelectric vibration member according to claim 1, wherein the bonding layer extends along at least a portion of a peripheral edge of the flange portion.

4. The piezoelectric vibration member according to claim 1, wherein the bonding layer extends along an entire peripheral edge of the flange portion.

5. The piezoelectric vibration member according to claim 1, wherein the flange portion has a joint surface that is bonded to the main surface with the bonding layer interposed therebetween, and a third surface roughness of the joint surface is greater than the second surface roughness of the surface of the recess.

6. The piezoelectric vibration member according to claim 5, wherein the joint surface includes a plurality of depressions and/or a plurality of projections.

7. The piezoelectric vibration member according to claim 6, wherein the plurality of depressions and/or the plurality of projections each have a linear shape.

8. The piezoelectric vibration member according to claim 6, wherein the plurality of depressions and/or the plurality of projections each have a diamond shape.

9. The piezoelectric vibration member according to claim 1, wherein the bonding layer includes lead-free, vanadium-based glass.

10. A method for manufacturing a piezoelectric vibration member, the method comprising:
hermetically sealing a piezoelectric vibrator in a space between a recess of a lid and a main surface of a substrate with a bonding layer by pressing the lid and the substrate against each other so as to cause the bonding layer to extend from the main surface of the substrate to a side surface of a flange portion of the lid; and
roughening the side surface of the flange portion such that a first surface roughness of the side surface is greater than a second surface roughness of a surface of the recess.

11. The method for manufacturing a piezoelectric vibration member according to claim 10, further comprising roughening a joint surface of the flange portion that is bonded to the main surface with the bonding layer interposed therebetween such that a first surface roughness of the joint surface is greater than a second surface roughness of a surface of the recess.

* * * * *